United States Patent [19]
Vogeli et al.

[11] Patent Number: 5,268,039
[45] Date of Patent: Dec. 7, 1993

[54] PHOTOVOLTAIC DEVICE INCLUDING SHUNT PREVENTING LAYER AND METHOD FOR THE DEPOSITION THEREOF

[75] Inventors: Craig Vogeli, New Baltimore; Prem Nath, Rochester Hills, both of Mich.

[73] Assignee: United Solar Systems Corporation, Troy, Mich.

[21] Appl. No.: 33,955

[22] Filed: Mar. 19, 1993

Related U.S. Application Data

[63] Continuation of Ser. No. 759,524, Sep. 13, 1991, abandoned.

[51] Int. Cl.$^5$ .................. H01L 31/0224; H01L 31/06
[52] U.S. Cl. .................................... 135/256; 136/258; 136/259; 437/2; 437/4; 257/436; 257/458
[58] Field of Search .............. 136/256, 258–262; 437/2–5; 257/436, 458

[56] References Cited

U.S. PATENT DOCUMENTS

| | | | |
|---|---|---|---|
| 4,532,372 | 7/1985 | Nath et al. | 136/256 |
| 4,590,327 | 5/1986 | Nath et al. | 136/256 |
| 4,598,306 | 7/1986 | Nath et al. | 357/30 |
| 4,633,033 | 12/1986 | Nath et al. | 136/256 |
| 4,633,034 | 12/1986 | Nath et al. | 136/256 |
| 4,695,674 | 9/1987 | Bar-on | 136/256 |
| 4,729,970 | 3/1988 | Nath et al. | 437/225 |
| 5,103,268 | 4/1992 | Yin et al. | 357/4 |

Primary Examiner—Aaron Weisstuch
Attorney, Agent, or Firm—Krass & Young

[57] ABSTRACT

A photovoltaic device which is resistant to shunt and short circuit defects developing between the opposed electrodes thereof. The photovoltaic device comprises an electrically conductive substrate, a semiconductor body including a photogenerative region, a layer of transparent conductive material, and means for collecting photogenerated current. In particular, a layer of low-conductivity material is operatively positioned between the layer of transparent conductive material and the collecting means, thereby resistively restricting the flow of electric current through short circuit portions. A method of fabricating such a shunt-resistant photovoltaic device is also disclosed.

29 Claims, 2 Drawing Sheets 5,268,039

PHOTOVOLTAIC DEVICE INCLUDING SHUNT PREVENTING LAYER AND METHOD FOR THE DEPOSITION THEREOF

This is a continuation of co-pending application Ser. No. 759,524, filed on Sep. 13, 1991, now abandoned.

FIELD OF THE INVENTION

The present invention relates generally to photovoltaic devices formed on a conductive substrate and particularly to solar cell structures in which the short circuit current path generated by any defect is minimized and to a method of fabricating same.

BACKGROUND OF THE INVENTION

Warming of the earth as a result of the current atmospheric increase in $CO_2$ is predicted and the demand for cleaner energy sources is increasing. Nuclear power generation, although not involving $CO_2$ atmospheric discharge, still has numerous unsolved problems. Thus, the development of a safer and cleaner energy source is demanded by the environmentally conscious public.

Of the various energy sources expected to be used in the future, solar cells are considered particularly promising because of they are clean, safe, easy to use and nondepletable.

Of the various types of solar cells, thin film amorphous silicon solar cells have demonstrated great potential for widespread future use because they can be manufactured by mass production techniques in large areas and at low cost. However, any large area solar cell will inherently include a large number of electrically short-circuited portions of the active region thereof, which short circuit portions could result in significantly reduced yields and low photovoltaic conversion efficiencies.

A thin-film solar cell formed on an electrically conductive substrate, such as a metallic substrate, has the advantage of being light-weight and shatter resistant, vis-a-vis, crystalline or polycrystalline solar cells. Typically, a thin stainless-steel web or a synthetic plastic resin with an electrically conductive layer formed thereon can be employed as the substrate for the thin film amorphous silicon solar cell. Such a solar cell can be produced by successively depositing layers of a lower electrode material, a semiconductor body, a transparent conductive material, etc. on the aforementioned substrate by the continuous roll-to-roll process set forth in U.S. Pat. No. 4,400,409, the disclosure of which is incorporated herein by reference.

However, the surface of a metal substrate, e.g., that of a stainless-steel substrate, is not perfectly smooth, but rather exhibits microscopic, morphological flaws or irregularities which extend above the deposition surface thereof. Such surface irregularities cannot be uniformly covered by the relatively thin body of semiconductor material (less than a micron in total thickness). Further, due to contaminants which are deposited during the thin-film CVD process, the deposition surface of the substrate may include pinholes, thereby causing a large number of current shunting portions (a portion in which an electric current follows a lower resistance pathway rather than being collected by the grid electrodes and/or bus bars of the solar cell) or short-circuiting portions to form between the upper and lower electrodes, resulting in the deterioration of the photoconversion efficiency of the solar cell. It is to be noted that for purposes of this disclosure, the terms "shunts" and "short circuits" will be used synonymously.

The foregoing problem can best be seen from a perusal of the drawings. FIG. 1 is a schematic cross-sectional view showing a short circuit portion of a thin film photovoltaic device 1 which has been formed on an electrically conductive substrate. In the drawing, the reference numeral 2 indicates the electrically conductive substrate, 4 indicates a layer of back-reflection material, 6 indicates a multilayered body of semiconductor material which includes a photogenerative region, 8 indicates a layer of transparent conductive material, 10 indicates an upper electrode for collecting photogenerated change carriers, 12 indicates an irregularity which shunts or short circuits said photogenerated change carriers, and 14 indicates an irregularity extending from the upper collecting electrode into and through the semiconductor body 6 so as to form a shunt or short circuit for photogenerated change carriers. The conductive substrate 2 also serves as the lower electrode of the solar cell. Generally, the shunt or short circuit portions 12 and 14 can be of two types: the type in which the lower electrode 2 and the upper collecting electrode 10 are short-circuited; and the type in which the short circuit path is caused when the upper collecting electrode 10 is formed on and in a subjacent pinhole section which exposes a portion of the lower electrode 2, i.e., the lower electrode is not covered with a layer of the thin film body of semiconductor material.

Accordingly, the electric current photogenerated in the semiconductor body 6 by the light incident on the surface of the transparent conductive layer 8 is at least partially diverted by the current shunting paths formed in the photovoltaic device 1, with the result that the photovoltaic-conversion efficiency deteriorates.

In order to solve the aforementioned problem, the present inventors have proposed various photovoltaic-device structures in U.S. Pat. Nos. 4,590,327, 4,633,033 and 4,633,034, the disclosure of which are incorporated herein by reference.

U.S. Pat. No. 4,590,327 discloses a photovoltaic device in which the current carrying section of the collecting electrode, composed of a finger-like grid assembly to collect photogenerated current and a bus-bar adapted to carry the current collected by the grid, is operatively disposed above the semiconductor body such that said the bus bar portion of the collecting electrode is insulated therefrom by a solid layer. If, in this structure, a pinhole exists below the finger-like grid assembly where no solid layer exists, through which any portion of the back-reflection layer or the conductive substrate is exposed, a shunt or short circuit condition results.

In the, photovoltaic structure disclosed in U.S. Pat. No. 4,633,033, the collecting electrode is operatively disposed between the transparent conductive layer and the semiconductor body. Directly below this collecting electrode, there is disposed a layer of high-resistance material for restricting the flow of short circuit-path current. If, in this structure, either (1) the grid portion of the collecting electrode, is formed by screen printing a conductive ink or paste or, (2) the high-resistance layer is formed from a resin ink or paste containing highly resistant organic macromolecules, gas is discharged during heating step, it becomes difficult to form a transparent electrode layer of satisfactory quality.

In the photovoltaic-device structure disclosed in U.S. Pat. No. 4,633,034, the upper collecting electrode is operatively disposed on the optically transparent conductive layer, and, a patterned layer of high electrical resistance material is disposed between that transparent conductive layer and the substrate. The patterned material layer is made about 10% larger than the overlying bus bar portion of the collecting electrode so as to restrict the flow of short circuit current. Like the photovoltaic structure disclosed in aforementioned U.S. Pat. No. 4,633,033, the '034 structure has the problem that, if the high-resistance layer is formed from a resin paste containing highly resistant organic macromolecules, gas is evolved during heating, thereby making it difficult to form high quality layers of semiconductor material and transparent conductive material.

U.S. Pat. No. 4,729,970 discloses a method in which, if a shunt or short circuit path should develop between the lower electrode and the upper electrode of transparent conductive material of a photovoltaic device, electrolysis is effected in an electrolyte disposed between the electrically conductive substrate or the lower electrode and the counter upper transparent electrode, thereby insulating the lower electrode from the short-circuited section of the upper transparent conductive electrode. However, when the collecting electrode is formed on either (1) an irregularity formed in a protruding section of the electrically conductive substrate and said protruding section extends through the thin film body of semiconductor material; or (2) a portion where a part of the lower electrode or a part of the conductive substrate is exposed through a pinhole in the body of semiconductor material and the layer of transparent conductive material, a shunt or short circuit path will still be generated.

Further, if the electrolytic process described in U.S. Pat. No. 4,729,970 is applied to a photovoltaic device having the structure depicted in U.S. Pat. No. 4,633,033, the collecting electrode or the layer of high-resistance material could delaminate. Likewise, if the electrolytic process of U.S. Pat. No. 4,729,970 is applied to a photovoltaic device having the structure depicted in U.S. Pat. No. 4,633,034, the collecting electrode, the layer of high-resistance material, or the body of semiconductor material could delaminate.

BRIEF SUMMARY OF THE INVENTION

In accordance with the principles of this invention, there is described a thin film photovoltaic device which includes an electrically conductive substrate (the lower electrode layer), a body of semiconductor material serving as the photogenerative member, a layer of transparent conductive material, and an upper electrode adapted to collect photogenerated charge carriers. An important feature of the present invention is the provision, directly below and in contact with the collecting electrode, a layer of low electrical conductivity material. The layer of low conductivity material is sized and shaped to correspond to the size and shape of the collecting electrode. In this manner, the current carrying capabilities of the short circuit current path are limited, which current shunting path is generated between portions of the lower electrode and portions of the collecting electrode and which shunting path has been a problem in such a photovoltaic devices for a lengthy period of time. In the structure of the instant invention, the layer characterized by low electrical conductivity is deposited after the semiconductor body (which includes a photogeneration member) and the layer of transparent conductive material have been successively deposited atop the electrically conductive substrate. This sequence of device formation makes it possible to obtain a semiconductor body and a layer of transparent conductive material of satisfactory quality which is not deleteriously influenced by the conditions for preparing the layer of high-resistance material.

Further, since said layer of high-resistance material can be sequentially deposited after performing the electrolytic process disclosed in aforementioned U.S. Pat. No. 4,729,970, there is no fear that the semiconductor body of the photovoltaic device will delaminate from subjacent layers. Furthermore, said electrolytic process helps to reduce the shunt or short circuit current path generated between portions of the layer of transparent conductive material and defective portions of the electrically conductive substrate which serve as the lower electrode of the photovoltaic device. The introduction of the layer of low-conductivity material of the instant invention between the layer of transparent conductive material and the current collecting electrode of the photovoltaic device, makes it possible to prevent a direct short circuit therebetween in a pinhole section where no semiconductor body exists to limit the flow of shunt current or short circuit current. This novel arrangement of active layers of the device makes it possible to substantially reduce the flow of short circuit current as compared to that flow of short circuit current in prior art devices; and, at the same time, said arrangement prevents the photovoltaic conversion efficiency from deteriorating, thereby optimizing the operational output of the photovoltaic device.

Thus, by adopting the principles set forth in the present invention, a photovoltaic device which is resistant to shunt and short circuit defects between the counterelectrodes thereof can be provided. These and other objects and advantages of the instant invention will become apparent from a detailed perusal of the Detailed Description of the Drawings which follows hereinafter.

DETAILED DESCRIPTION OF THE PREFERRED EMBODIMENT

The present invention will now be described in detail with specific reference to the accompanying drawings.

Generally, the present invention relates to an improved photovoltaic device in which a semiconductor body, including a layer of photogenerative material, is operatively disposed between a lower electrode formed by an electrically conductive substrate and an upper electrode including current collecting means. The photovoltaic device is characterized by a layer of low-conductivity material operatively disposed below the upper electrode. In the fabrication of this photovoltaic device, the semiconductor body, which includes the photogenerative layer of semiconductor material, is first deposited on the electrically conductive substrate and then the layer of transparent conductive material is formed on semiconductor body. Subsequently, a layer of low-conductivity material is formed atop the layer of transparent conductive material, and then the current-collecting layer is formed atop the layer of low-conductivity material.

Figure 1:
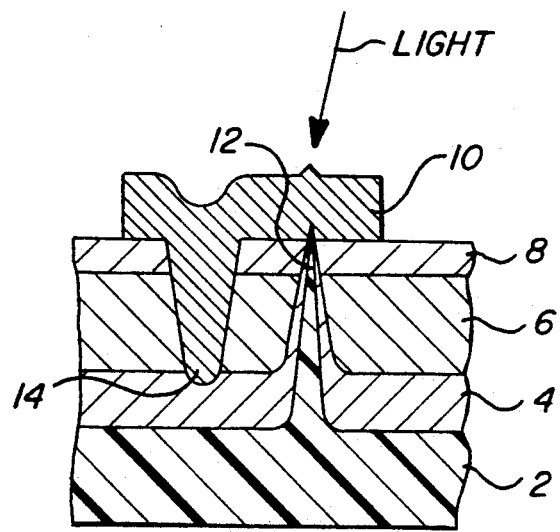
FIG. 1 is a schematic enlarged cross-sectional view, partially cut-away, illustrating defective irregularities which can cause current shunting or short-circuiting paths, in photovoltaic device structures of the prior art.
Figure 2:
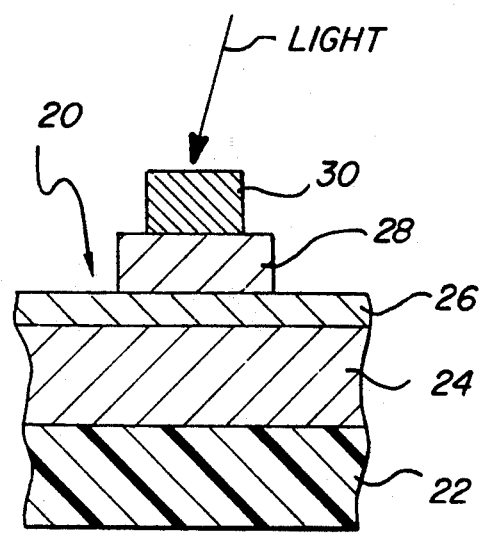
FIG. 2 is an enlarged, schematic cross-sectional view, partially cut-away, illustrating the preferred embodiment of the photovoltaic-device structure of the present invention.

Turning now to FIG. 2, the basic structure of the preferred embodiment of the photovoltaic device 20 shown therein includes an electrically conductive substrate 22, a semiconductor body 24 including a layer of photogenerative material, a layer of transparent conductive material 26, a layer of low conductivity material 28 and a complex current collection matrix or network 30 which includes grid fingers and bus bars.

Examples of the materials from which the aforementioned electrically-conductive substrate 22 is fabricated include stainless steel, aluminum, copper, titanium, carbon sheet, galvanized-steel plate, and a synthetic plastic film upon which an electrically conductive layer (not shown) is formed. Examples of the materials from which the layer of electrically conductive material may be fabricated include Ti, Cr, Mo, W, Al, Ag, and Ni. To effectively utilize incident light, a layer of back-reflection material may be operatively disposed between the electrically conductive substrate 22 and the semiconductor body 24. The back-reflection layer may consist of an electrically conductive layer covered or uncovered with a metal oxide layer. The exemplified materials of the metal layer and the metal oxide layer can be deposited by resistance-heating, electron beam, sputtering, or any other process well known to those ordinarily skilled in the art.

Examples of the semiconductor materials used in the fabrication of the layer of photogenerative material of the photovoltaic device of the instant invention include pin-junction amorphous silicon alloy material, pn-junction polycrystalline silicon, and a compound semiconductor material such as CuInSe$_2$/CdS. In the preferred embodiment, wherein amorphous silicon alloy material is used, the aforementioned layer of silicon alloy material is fabricated by plasma enhanced CVD using hydrogen diluted silane gas or the like as a precursor. In the alternatively preferred embodiment wherein polycrystalline silicon is used, the layer of semiconductor material is fabricated by forming molten silicon into a sheet or by heat-treating amorphous silicon. Finally, in the alternately preferred embodiment wherein the cell is formed of a compound semiconductor material, CdInSe$_2$/CdS is formed by electron beam deposition, sputtering, or electro-precipitation (precipitation through electrolysis in an electrolyte). Further, the aforementioned semiconductor body of the solar cell may be formed as a spectrum splitting tandem device in which a plurality of photovoltaic cells are stacked in series relationship, each cell dedicated to photogenerating current from a specific portion of the solar spectrum.

Examples of the materials from which the layer of transparent electrically conductive material in the photovoltaic device of this invention is fabricated, include In$_2$O$_3$, SnO$_2$, In$_2$O$_3$—SnO$_2$(ITO), ZnO, TiO$_2$, Cd$_2$SnO$_4$, and a crystalline semiconductor material doped with a high concentration of impurities. The layer of transparent conductive material may be formed by resistive heating, electron-beam, sputtering, spray pyrolysis, plasma CVD, impurity-diffusion, or any other technique known to ordinarily skilled artisans.

The layer of low-conductivity material of the preferred embodiment of the photovoltaic device 20 of the instant invention is formed of a material characterized by low electric conductivity. Most preferred is at least one of the following materials: polymeric material, semiconductor material, carbon, metal oxide, cermets, and metal. Preferably, said layer of low electrical conductivity material may be formed by dispersing, in a polymeric-resin solution, fine powder selected from at least one of the following from the group consisting of: a semiconductor material such as silicon and germanium, carbon, a metallic oxide such as tin oxide, indium oxide, zinc oxide, and titanium oxide, cermet, a metallic material such as copper, nickel, palladium, and solder. This dispersion is then dried into a paste-like substance in such a manner that the sheet resistance thereof is characterized by a resistivity which falls substantially in the range from 0.1 $\Omega/\square$ to 1000 $\Omega/\square$, and more preferably, from about 1 $\Omega/\square$ to 300 $\Omega/\square$, and most preferably, from about 5 $\Omega/\square$ to 200 $\Omega/\square$.

The current collecting network 30 of the photovoltaic device 20 of the present invention is placed in electrical communication with the layer of transparent conductive material 26 through the intermediation of the aforementioned layer of low-conductivity material 28. It is important that the aforementioned layer of low-conductivity material 28 be of about the same size and shape as, or larger than, the aforementioned current collecting network by, preferably about 5% to 100%, and more preferably by 10% to 50%.

Figure 3:
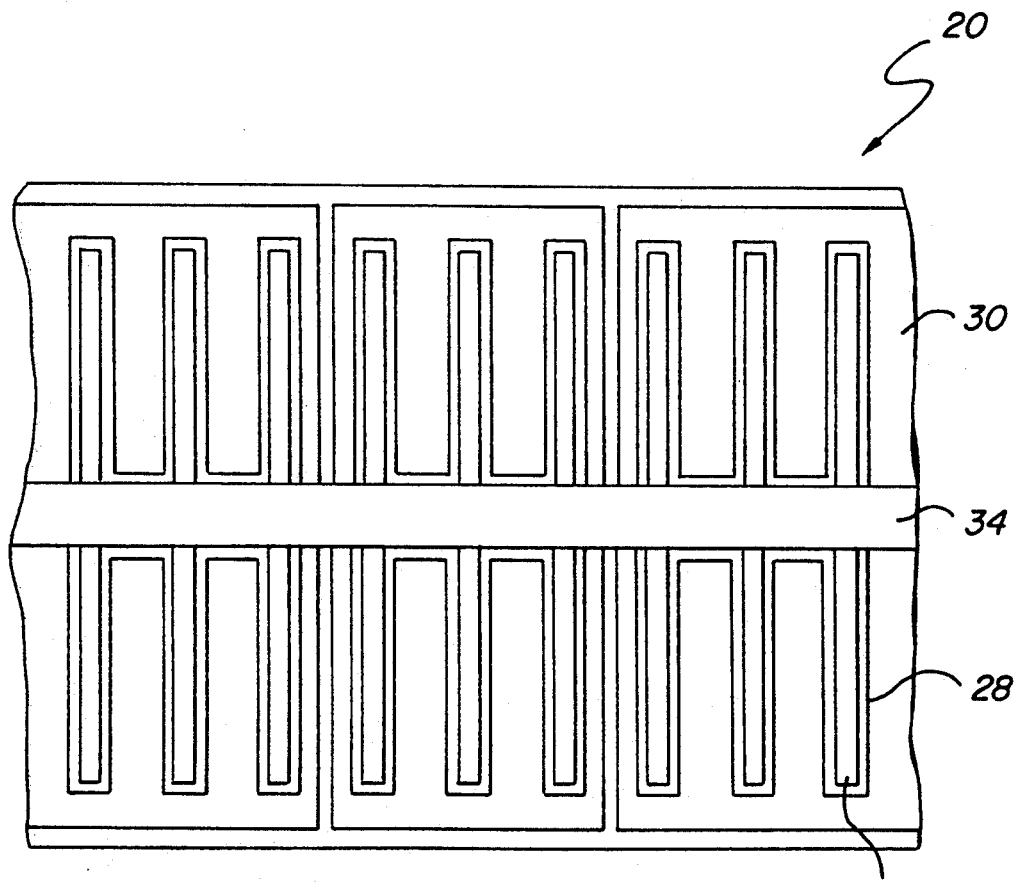
FIG. 3 is a top plan view illustrating the pattern of the upper current collecting electrode of the preferred embodiment of the photovoltaic device of FIG. 2 of the present invention, said current collecting electrode being formed of a complex network of bus bars and grid fingers.

The current collecting network 30 is defined by a complex matrix of grid-like electrode fingers and bus bars. The bus bars carry the photogenerated electric current collected by the matrix of grid-like electrode fingers. More specifically, FIG. 3 is a top plan view of the current carrying network of the photovoltaic device 20 of the present invention as seen from the light-incidence surface thereof. The device 20 shown in FIG. 3 includes the layer of transparent conductive material 26, the layer of low-conductivity material 28, grid electrode fingers 32 and a bus bar 34. When irradiated with incident light, the photogenerative layer of the photovoltaic device 20 generates an electric current, the charge carriers of which are collected by the grid electrode fingers 32 through the layer of low-conductivity material 28 and are then carried by bus bar 34 to the downstream load.

The material from which the collecting network 30, which serves as the collecting means, is fabricated can be selected of a conductive ink or paste including therein Ti, Cr, Mo, W, Al, Ag, Ni, Cu, Sn, silver, and combinations thereof. The current collecting electrode 5 may be formed by, for example, sputtering using a mask pattern, by resistive-heating, by plasma CVD, by a method in which patterning is effected through etching after depositing a layer of metallic material over the deposition surface, by directly forming an electrode pattern by photo CVD, by plating after forming a negative-pattern mask of the electrode pattern, or by printing an electrically conductive ink or paste. The conductive ink or paste used may be prepared by dispersing fine powder of a material selected from the group consisting of silver, gold, copper, nickel, indium, tin, and combinations thereof in a binder polymer. The binder polymer may be a synthetic polymer resin selected from the group consisting of polyester resin, epoxy resin, acrylic resin, alkyd resin, polyvinyl acetate, rubber, urethane, phenol, and combinations thereof. The grid electrodes 32 and the bus bar 34 may be formed integrally or separately. When forming the bus bars 34 separately from the grid electrodes 32, tin-plated foils or wires of a metallic material such as copper are preferably used as the bus bars, which are attached to the grid electrodes 32 by means of an electrically conductive adhesive or solder.

Figure 4:
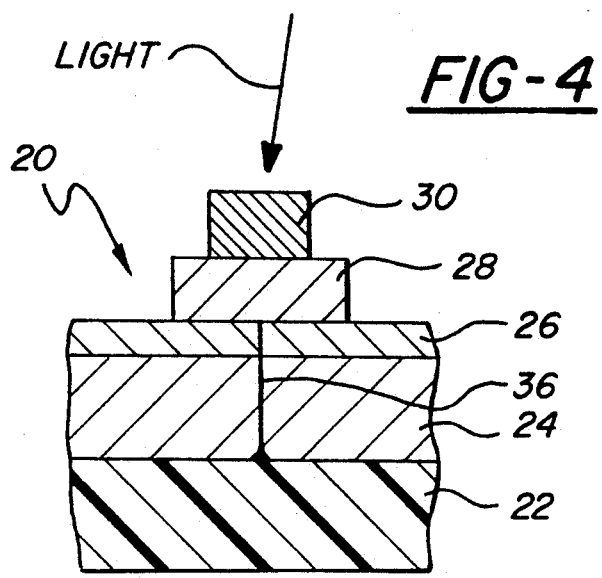
FIG. 4 is an enlarged schematic cross-sectional view, partially cut-away, illustrating the preferred embodiment of the photovoltaic-device of FIG. 2 of the present invention with a current shunting path operatively disposed directly below the layer of low-conductivity material.

FIG. 4 is a cross-sectional view of the preferred embodiment of the photovoltaic device 20, in which, in accordance with the present invention, an electrically collecting electrode 30 is formed where a shunt or short circuit portion 36 exists between the electrically conductive substrate 22 and the layer of low-conductivity material 28. In FIG. 4, the reference numeral 24 continues to refer to the semiconductor body of the photovoltaic device 20.

Figure 5:
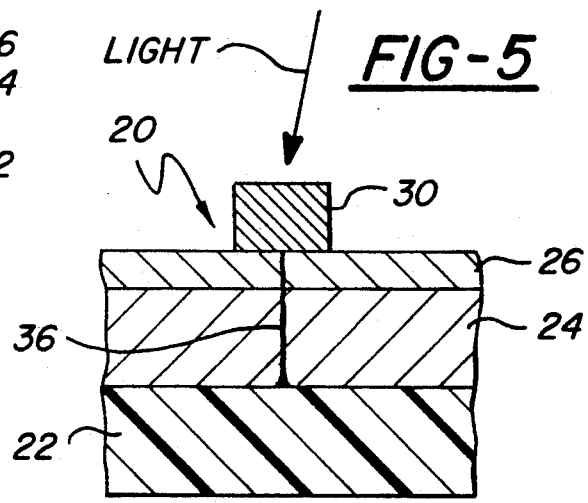
FIG. 5 is an enlarged schematic, cross-sectional view, partially cut-away, illustrating a photovoltaic device of the prior art without the presence of the layer of low-conductivity material of the present invention and, with a current shunting path operatively disposed below the collecting electrode.

FIG. 5 is a cross-sectional view showing the prior art embodiment of the photovoltaic device 20 in which the collecting electrode network 30 is placed in direct contact over the current shunt or short circuit portion 36 which is formed between the electrically conductive substrate 22 and the layer of transparent conductive material 26 without the intermediation of the layer of low-conductivity material of the instant invention. In FIG. 5, the reference numeral 24 indicates the photogenerative layer of the semiconductor body. When electrically connected to a load and irradiated with light, the photovoltaic device 20 of FIG. 5 generates an electric current, the charge carriers of which are extracted by the load. Since, however, the photogenerated current is shunted through the short circuit defect 36, the amount of electric current actually delivered to said load is less than that photogenerated by the aforementioned photogenerative layer. In the case of the photovoltaic device 20 illustrated in FIG. 4, in contrast to FIG. 5, the presence of the layer of low-conductivity material 28 operatively disposed between the short circuit defect 36 and the current collecting electrode 30 provides a high shunting resistance. The result of that layer of low conductivity material 26 is a reduction of the amount of current which is shunted. The amount of electrical current that can be extracted at the load is greater than that in the case of the photovoltaic device 20 of FIG. 5; i.e., the photoconversion efficiency of the photovoltaic device 20 has been improved.

Figure 6:
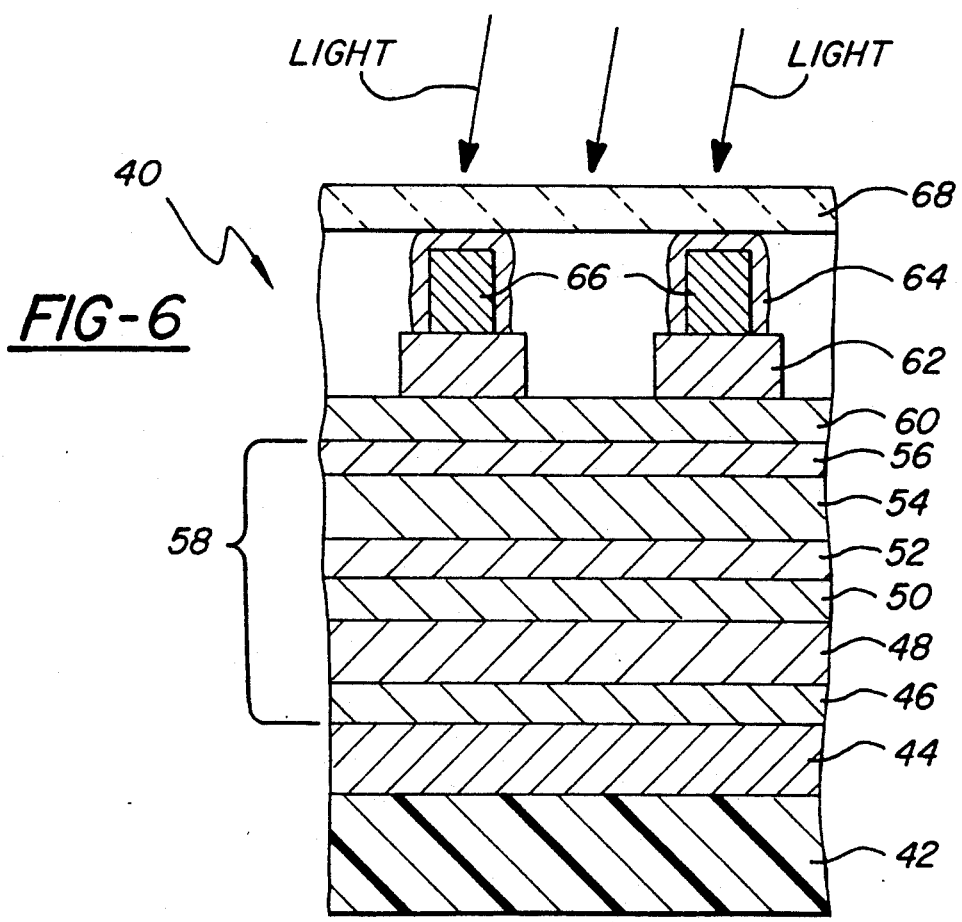
FIG. 6 is an enlarged, schematic cross-sectional view, partially cut-away; illustrating the preferred embodiment of a photovoltaic device of the present invention in which successive PIN-type layers of amorphous silicon alloy material form the semiconductor body.

FIG. 6 is a cross-sectional view of an amorphous-silicon solar cell which constitutes the preferred embodiment of the instant invention, which invention will now be described with specific reference to that preferred embodiment.

THE FIG. 6 EMBODIMENT

A 3000 Å thick Al film and a 700 Å thick ZnO film were successively deposited, as by sputtering, on a cleansed stainless-steel substrate 42, thus forming a dual layered back-reflection material 44. Then, a layer of n-type a-Si alloy material was formed from a precursor gaseous mixture of $SiH_4$, $BF_3$ and $H_2$, at a substrate temperature of about 250° to 300° C. by Rf or microwave plasma CVD. Using these layers of a-Si alloy material, the following layers were successively deposited: an n-layer 46 (75 to 150 Å thick)/an i-layer 48 (2000 to 4000 Å thick)/ a p-layer 50 (75 to 100 Å)/an n-layer 52 (75 to 100 Å thick)/ an i-layer 54 (750 to 1000 Å thick)/a p-layer 56 (75 to 100 Å thick), thereby forming a multi-layered semiconductor body 58.

Subsequently, a 500–1000 Å thick $In_2O_3$ film 60 was formed by the resistive-heating vapor deposition of In in an $O_2$ atmosphere while keeping the substrate temperature at about 250° to 300° C. After deposition of the $In_2O_3$ layer was complete, the cell may optionally be subjected to a passivation process which in the present example involved disposing it in etchant bath of a mild acid such as $FeCl_3$ or dilute hydrochloric acid and then passing a reverse bias current therethrough to passivate any defect regions. These techniques are more fully detailed in U.S. Pat. No. 4,729,970 discussed hereinabove. Then, a 1-liquid carbon paste of epoxy type manufactured by Emerson Cuming Corp. (also by Taiyo Ink K.K) was printed at predetermined positions by a screen printer and dried for three minutes in an extreme-infrared-radiation furnace at about 150° C., thereby forming the layer of low-conductivity material 62 characterized by a sheet resistance of about 20 Ω/□. Further, silver paste #5007 manufactured by DuPont was then screen-printed on the layer of low-conductivity material 64 and dried for three minutes in an extreme-infrared-radiation furnace at 130° C., thereby forming the grid electrode network 66 whose size is about 60% of the layer of low-conductivity material 64. In this way, a tandem photovoltaic device 40 was fabricated. Sixteen photovoltaic devices 40 were fabricated by the aforedescribed method. Each of said devices 40 had the grid electrode 66 thereof electrically connected in parallel to a tin-plated-copper-foil bus bar 68 by means of an electrically conductive adhesive agent containing silver so that a predetermined level of photogenerated electric current can be controlled. Thus, a unit photovoltaic cell was produced. One hundred unit photovoltaic cells prepared in this way were tested for the electrical characteristics thereof under an incident irradiation of AM 1.5, i.e., 100 mW/cm². The number of photovoltaic cells characterized by a fill factor of 65% or greater was two times greater as compared to the percentage of photovoltaic cells in the case in which no layer of the low-conductivity material of the present invention was employed. It should be apparent from this result that the introduction of the layer of low-conductivity material of the present invention markedly improves solar cell characteristics.

In practical use, the bus bars 66 and the stainless-steel substrate 42 of a plurality of adjacent unit photovoltaic cells 40 as described hereinabove are electrically interconnected in series so as to form a photovoltaic cell system which provides a desired level of voltage.

As described above, the layer of low-conductivity material of the present invention prevents, or at least substantially reduces, performance degradation attributable to any current shunt or short circuit pathway formed in a thin film photovoltaic device and, at the same time improves product yield.

It is to be understood that the instant invention is not limited to the precise structure of the illustrated embodiments. It is intended that the foregoing description of the presently preferred embodiments be regarded as illustrative rather than as a limitation of the present invention. It is the claims which follow, including all equivalents, which are intended to define the scope of this invention.

We claim:

1. In a photovoltaic device of the type comprising:
   an electrically conductive substrate;
   a photovoltaic semiconductor body operative to generate a photocurrent in response to the absorption of illumination thereby, said body having opposed first and second surfaces, the second surface of said body being disposed in electrical contact with said substrate;
   a layer of transparent, electrically conductive material disposed upon the first surface of the semiconductor body, and a current collecting network comprising grid fingers and bus bars, operative to collect the photocurrent, disposed atop the layer of transparent conductive oxide; wherein the improvement comprises in combination;
   a layer of low conductivity material interposed between the entirety of said current collecting network and said layer of low conductivity material having a sheet resistance ranging from 0.1 $\Omega/\square$ to 1000 $\Omega/\square$, said layer being 5–100% longer and wider than the length and width of said current collecting network, said low conductivity layer being operative to restrict the flow of electrical current between said current collecting network and said layer of transparent conductive material.

2. A device as in claim 1, wherein said layer of low-conductivity material is formed essentially of a material selected from the group consisting of polymeric material, semiconductor material, carbon, ceramics, cermet material, and combinations thereof.

3. A device as in claim 1, wherein said layer of low-conductivity material is deposited after selectively passivating portions of said layer of transparent conductive material which shunt current between said layer of transparent conductive material and said conductive substrate.

4. A device as in claim 1, wherein said layer of transparent conductive material is formed of a material selected from the group consisting of indium oxide, tin oxide, zinc oxide, titanium oxide, cadmium/tin oxide, cadmium stannate, and combinations thereof.

5. A device as in claim 1, wherein said semiconductor body includes a multi-layered structure of at least p-type, i-type and n-type layers of semiconductor material mainly formed of elements of Group IV of the Periodic Table.

6. A device as in claim 1, wherein said semiconductor body includes a multi-layered structure of at least p-type and n-type layers of semiconductor material mainly formed of elements of Group IV of the Periodic Table.

7. A device as in claim 1, wherein said semiconductor body includes a multi-layered structure of at least p-type and n-type layers of semiconductor material mainly formed of elements of Group II and Group IV of the Periodic Table.

8. A device as in claim 1, wherein said semiconductor body includes a multi-layered structure of at least p-type and n-type layers of semiconductor material mainly formed of elements of Group III and Group V of the Periodic Table.

9. A device as in claim 1, wherein said grid electrodes are electrically connected to said bus bars by an electrically adhesive agent.

10. A device as in claim 1, wherein said grid electrodes are electrically connected to said bus bars by soldering.

11. A device as in claim 1, wherein said grid electrodes are formed of a material selected from the group consisting of:
    a conductive ink, a conductive paste, a metallic material formed by plating, a metallic material formed by CVD or resistance heating, and mixtures thereof.

12. A device as in claim 1, wherein a back-reflector is operatively disposed between said conductive substrate and said semiconductor body.

13. A device as in claim 12, wherein said back-reflector is formed of a material selected from the group consisting of:
    silver, aluminum, titanium, molybdenum, chromium, tungsten, and mixtures thereof.

14. A device as in claim 12, wherein said back-reflector is a multi-layered structure, one layer of which is formed of a material selected from the group consisting of silver, aluminum, titanium, molybdenum, chromium, tungsten, and mixtures thereof; the second layer of which is formed of a metal oxide selected from the group consisting of: indium oxide, tin oxide, zinc oxide, titanium oxide, cadmium/tin oxide, and mixtures thereof.

15. A method of fabricating a photovoltaic device, comprising the steps of:
    (1) providing an electrically conductive substrate;
    (2) forming a semiconductor body having opposed first and second surfaces such that the second surface thereof contacts said conductive substrate;
    (3) forming a layer of transparent conductive material on the first surface of said semiconductor body;
    (4) forming a current collecting network, comprising grid fingers and bus bars, operative to collect current photogenerated by said photovoltaic device, atop a portion of said layer of transparent conductive material; and
    (5) operatively disposing a layer of a low-conductivity material having a sheet resistance of 0.1 $\Omega/\square$ to 1000 $\Omega/\square$ on top of said layer of transparent conductive material and beneath the entirety of said current collecting network, said layer of low conductivity material being 5 to 100% longer and wider than said current collecting network, whereby the flow of electric current between portions of said current collecting network and portions of said layer of conductive material is restricted.

16. A method as in claim 15, comprising the step of selecting said layer of low-conductivity material from the group consisting of: polymeric material, semiconductor material, carbon, ceramics, cermets, and combinations thereof.

17. A method as in claim 15, further comprising the step of forming said collecting electrode of a network of grid electrodes and bus bars.

18. A method as in claim 17, comprising the step of electrically connecting said bus bars to said grid electrodes by means of an electrically conductive adhesive agent.

19. A method as in claim 17, comprising the step of connecting said bus bars to said grid electrodes by soldering.

20. A method according to claim 17, comprising the step of forming said grid electrode of a material selected from the group consisting of a conductive ink, a conductive paste, a metallic material formed by plating, a metallic material formed by CVD or by resistance heating, and combinations thereof.

21. A method as in claim 15, comprising the step of forming said layer of low-conductivity material after selectively passivating those portions of said layer of transparent conductive material which shunt current from said conductive substrate.

22. A method as in claim 15, comprising the step of forming said layer of transparent conductive material of a material selected from the group consisting of indium oxide, tin oxide, zinc oxide, titanium oxide, cadmium/tin oxide, cadmium stannate, and mixtures thereof.

23. A method as in claim 15, comprising the step of forming said semiconductor body as a multi-layered structure including at least p-type, i-type and n-type layers of semiconductor material formed of elements of Group IV of the Periodic Table.

24. A method as in claim 15, comprising the step of forming said semiconductor body as a multi-layered structure including at least p-type and n-type layers of semiconductor material formed of elements of Group IV of the Periodic Table.

25. A method as in claim 15, comprising the step of forming said semiconductor body as a multi-layered structure including at least p-type and n-type layers of semiconductor material formed of elements of Group II and Group IV of the Periodic Table.

26. A method as in claim 15, comprising the step of forming said semiconductor body as a multi-layered structure including at least p-type and n-type layers of semiconductor material formed of elements of Group III and Group V of the Periodic Table.

27. A method as in claim 15, comprising the step of forming a back-reflection layer between said conductive substrate and said semiconductor body.

28. A method as in claim 27, comprising the step of forming said back-reflection layer of a material selected from the group consisting of silver, aluminum, titanium, molybdenum, chromium, tungsten, and combinations thereof.

29. A method as in claim 27, comprising the step of forming said back-reflection layer as a multi-layered structure, one layer of which includes a metallic material selected from the group consisting of silver, aluminum, titanium, molybdenum, chromium, tungsten, and combinations thereof; and the second layer of which includes a metal oxide selected from the group consisting of indium oxide, tin oxide, zinc oxide, titanium oxide, cadmium/tin oxide, cadmium stannate, and combinations thereof.

* * * * *